United States Patent
Kim et al.

(10) Patent No.: US 9,093,023 B1
(45) Date of Patent: Jul. 28, 2015

(54) ORGANIC LIGHT EMITTING DISPLAY DEVICE AND PIXEL REPAIRING METHOD

(71) Applicant: LG Display Co., Ltd., Seoul (KR)

(72) Inventors: Jeong Hwan Kim, Seoul (KR); Hyun Haeng Lee, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/547,885

(22) Filed: Nov. 19, 2014

(51) Int. Cl.
*H01L 27/32* (2006.01)
*G09G 3/32* (2006.01)

(52) U.S. Cl.
CPC .......... *G09G 3/3225* (2013.01); *G09G 2330/08* (2013.01); *H01L 27/3223* (2013.01); *H01L 27/3244* (2013.01)

(58) Field of Classification Search
CPC ................. H01L 27/3244; H01L 27/3223
USPC .............................................. 257/40, 72, 81
See application file for complete search history.

(56) References Cited

U.S. PATENT DOCUMENTS 8,928,007 B2 * 1/2015 Akagawa et al. ............... 257/81
2014/0183481 A1 * 7/2014 Lee et al. ......................... 257/40

* cited by examiner

*Primary Examiner* — Cuong Q Nguyen
(74) *Attorney, Agent, or Firm* — Birch, Stewart, Kolasch & Birch, LLP

(57) ABSTRACT

An organic light emitting display device including a plurality of pixel areas including an emission area and a pixel circuit area, the plurality of pixel areas being configured to emit light; a plurality of dummy pixel areas formed adjacent to the plurality of pixel areas to include a non-emission area and a pixel circuit area; an anode electrode form in the plurality of dummy pixel areas; and a bridge line formed from a portion of the anode electrode and in the plurality of pixel areas.

20 Claims, 9 Drawing Sheets

ORGANIC LIGHT EMITTING DISPLAY DEVICE AND PIXEL REPAIRING METHOD

CROSS-REFERENCE TO RELATED APPLICATIONS

This application claims the benefit of the Korean Patent Application No. 10-2014-0066459 filed on May 30, 2014, which is hereby incorporated by reference as if fully set forth herein.

BACKGROUND

1. Field of the Invention

The present invention relates to an organic light emitting display device, and more particularly, to an organic light emitting display device and a pixel repairing method, which repair hot spot errors or dark spot errors of pixels formed at an outermost line (formed on a last horizontal line) among a plurality of pixel areas emitting light by using a dummy pixel.

2. Discussion of the Related Art

Organic light emitting display devices according to related art emit light from organic light emitting diodes (OLEDs) to display an image. The organic light emitting display devices include, depending on a driving type, passive matrix organic light emitting display devices and active matrix organic light emitting display devices.

A passive matrix organic light emitting display device includes a plurality of pixels being arranged in a matrix and not including thin film transistors (TFTs). In the passive matrix organic light emitting display devices, power consumption increases, and resolution is limited.

An active matrix organic light emitting display device has a plurality of TFTs respectively formed in a plurality of pixels which are arranged in a matrix type. Each of the plurality of pixels is driven according to a switching operation of a TFT and a voltage charged into a storage capacitor Cst.

The active matrix organic light emitting display devices have low power consumption and high resolution compared to the passive matrix organic light emitting display devices. An active matrix organic light emitting display device is suitable for a display device requiring a high resolution and a large area. For convenience, the present specification also refers to an active matrix organic light emitting display device is as an organic light emitting display device.

FIG. 1 is a circuit diagram for describing a pixel structure of a general organic light emitting display device. An equivalent circuit of one of a plurality of pixels which uses an external compensation method is formed in a display panel.

Each pixel of the display panel includes an OLED, which emits light with a data current Ioled applied thereto, and a pixel circuit PC which drives the OLED. Also, a plurality of lines for supplying a driving voltage and signals to the OLED and the pixel circuit PC are formed in the display panel.

Here, the pixel circuit PC includes a first switch TFT ST1, a second switching TFT ST2, a driving TFT DT, and a capacitor Cst. The plurality of lines includes a data line DL, a gate line GL, a driving voltage line PL, a sense signal line SL, and a reference voltage line RL.

The first switching TFT ST1 is turned on according to a scan signal (a gate driving signal) supplied to the gate line GL. The first switching TFT ST1 is turned on, and a data voltage Vdata supplied to the data line DL is supplied to the driving TFT DT.

The driving TFT DT is turned on with the data voltage Vdata supplied from the first switching TFT ST1. The data current Ioled flowing to the organic light emitting diode OLED is controlled with a switching time of the driving TFT DT.

When the scan signal is applied through the gate line GL, the first switching TFT ST1 is turned on. At this time, a signal from the first switching TFT ST1 is input to a gate electrode of the driving TFT DT, which is turned on. When the driving TFT DT is turned on, a driving current applied through the driving voltage line PL is input to the organic light emitting diode OLED, which emits light.

For external compensation, the sense signal line SL is formed in the same direction as that of the gate line GL. The second switching TFT ST2, which is turned on according to a sense signal applied through the sense signal line SL, is formed. The data current Ioled, which is supplied to the organic light emitting diode OLED according to the second switching TFT ST2 being turned on, is sensed by using an analog-to-digital converter (ADC) of a data driving integrated circuit (IC). A data voltage supplied to each pixel is compensated for according to a sense value of each pixel sensed by the ADC, thereby compensating for the changes in a threshold voltage "Vth" and mobility characteristic of the driving TFT DT.

Next, FIG. 2 is a plan view of a portion of a display area of a general organic light emitting display device, and is a view illustrating one unit pixel disposed on a last horizontal line among all the pixels. An area in which a pixel circuit is formed in each pixel area is defined as a pixel circuit area CA. The pixel circuit includes a driving TFT 20, a scan TFT 30, and a sense TFT 40. An area, in which an OLED is formed, is defined as an emission area EA.

A driving voltage line (VDD line) and a data line are formed in a vertical direction, and a gate line and a sense signal line (sense line) are formed in a horizontal direction. The emission area EA is defined by an intersection of a data line and a gate line. A plurality of pixels are formed in the emission area. A red pixel, a green pixel, a blue pixel, and a white pixel constitute one unit pixel 10. A pixel circuit area CA is defined between the gate line and the sense signal line.

A source electrode of the driving TFT 20 is connected to the driving voltage line, and a drain electrode is connected to an anode electrode of the OLED. A gate electrode of the driving TFT 20 is connected to a drain electrode of the scan TFT 30. A gate electrode of the scan TFT 30 is connected to the gate line, and a source electrode is connected to the data line. A gate electrode of the sense TFT 40 is connected to the sense signal line, a drain electrode is connected to the drain electrode of the driving TFT 20, and a source electrode is connected to a reference voltage line (Ref line).

Next, FIG. 3 is a diagram illustrating that a pixel in which a hot spot error occurs is repaired and blackened. When the driving TFT 20, the scan TFT 30, or the sense TFT 40 formed in one pixel area is not driven as normal, a dark spot error occurs because a current is not applied to an OLED. Also, when the source electrode of the driving TFT 20 is short-circuited with the drain electrode (i.e., a short circuit occurs between lines and metal layers), the driving TFT 20 in each pixel is not driven as normal, and a voltage applied to the source electrode may be directly applied to the drain electrode. In this case, the driving TFT 20 is maintained in a turn-on state without being turned off, and thus, a hot spot error occurs in which the OLED continuously emits light. When a dark spot error or a hot spot error occurs in a specific pixel, it is impossible to repair a blackened pixel area, and thus, a blackened state is maintained as-is.

A whitened pixel area is cut, through laser cutting, at a point A in which the driving TFT 20 of the pixel circuit driving a whitened pixel is connected to an anode electrode of the OLED. That is, a connection between the driving TFT 20 and the anode electrode of the OLED is cut by performing laser cutting in an open area between the storage capacitor and the anode electrode of the OLED.

Moreover, a point B in which the drain electrode of the sense TFT 40 is connected to the driving TFT 20 is cut through laser cutting. Also, the anode electrode is electrically connected via a welded OLED to a cathode electrode. The welded OLED is blackened due to the welded OLED being formed in the emission area EA of a pixel in which a hot spot error occurs.

Because a dark spot error is low in visibility, a user cannot recognize a dark spot error. On the other hand, since a hot spot error is high in visibility, the user can immediately recognize a hot spot error, and thus, a whitened pixel area is blackened.

When a dark spot occurs in only one hot spot in an entire area of the display panel, an error prevents production of the display device. On the other hand, when a dark spot occurs in ten to twenty pixels in the entire area of the display panel, a pixel area in which a hot spot error occurs can be repaired by blackening the pixel area.

As described above, a hot spot is repaired by blackening the pixel area but the hot spot is not fully repaired. For this reason, there is a limitation in increasing a yield rate of products. Since millions to tens of millions of pixel areas are formed in an organic light emitting display device, a display panel in which all pixel areas have no error is difficult to manufacture. Also, in a display panel in which all pixel areas have no error, a yield rate is reduced, causing an increase in the manufacturing cost.

In particular, when dark spots occur in pixel areas which are arranged on first to N-1st horizontal lines among N numbers of horizontal lines formed in the display panel, pixel areas formed at a lower portion of the display panel are repaired, and the dark spots are repaired by receiving signals from the pixel areas formed at the lower portion.

However, when dark spots occur in pixel areas (i.e., pixel areas formed on a last horizontal line) formed at an outermost portion among pixel areas (i.e., pixel areas emitting light) formed on an Nth horizontal line in the display panel, there are no pixels in lower portions of the display panel that can provide signals to pixels in the outermost portions of the display panel.

SUMMARY

Accordingly, the present invention is directed to provide an organic light emitting display device and a pixel repairing method that substantially obviate one or more problems due to limitations and disadvantages of the related art. The organic light emitting display device, and a pixel repairing method therefore, is repaired by correcting a hot sport error or dark spot error of each of pixels arranged on a last horizontal line in the organic light emitting display device.

Other features and advantages of the present invention are clearly understood by those skilled in the art from descriptions below.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

The foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
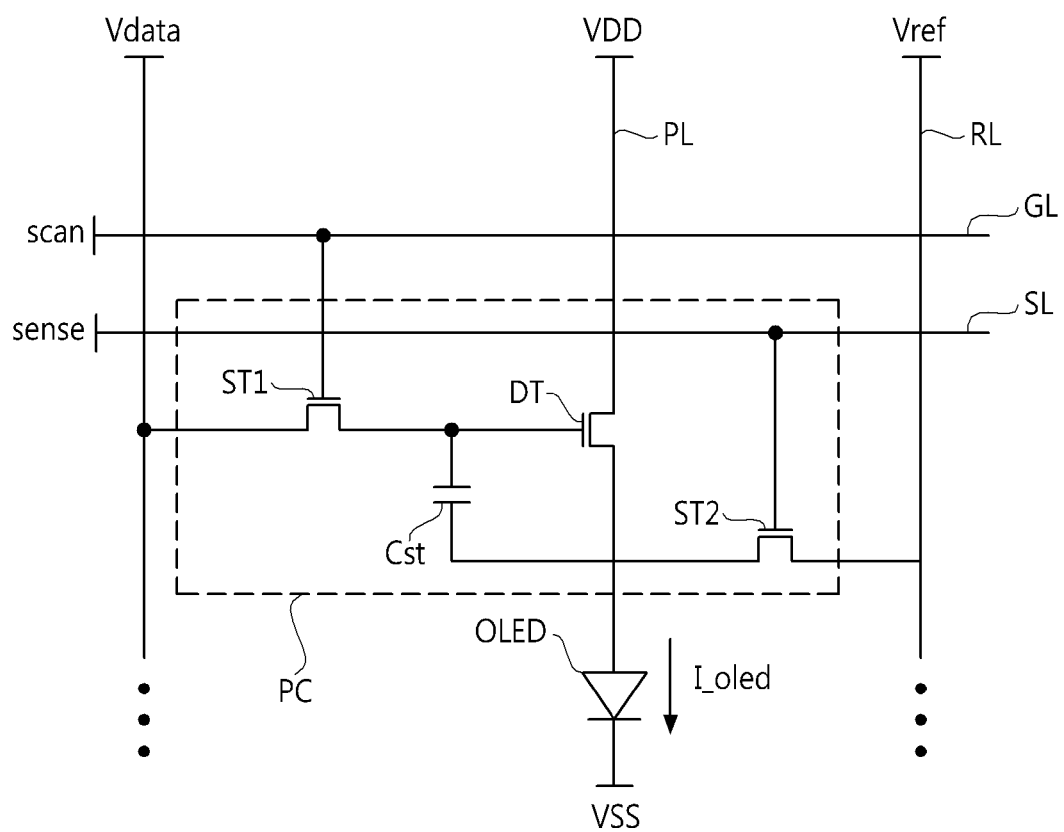
FIG. 1 is a circuit diagram for describing a pixel structure of an organic light emitting display device.
Figure 2:
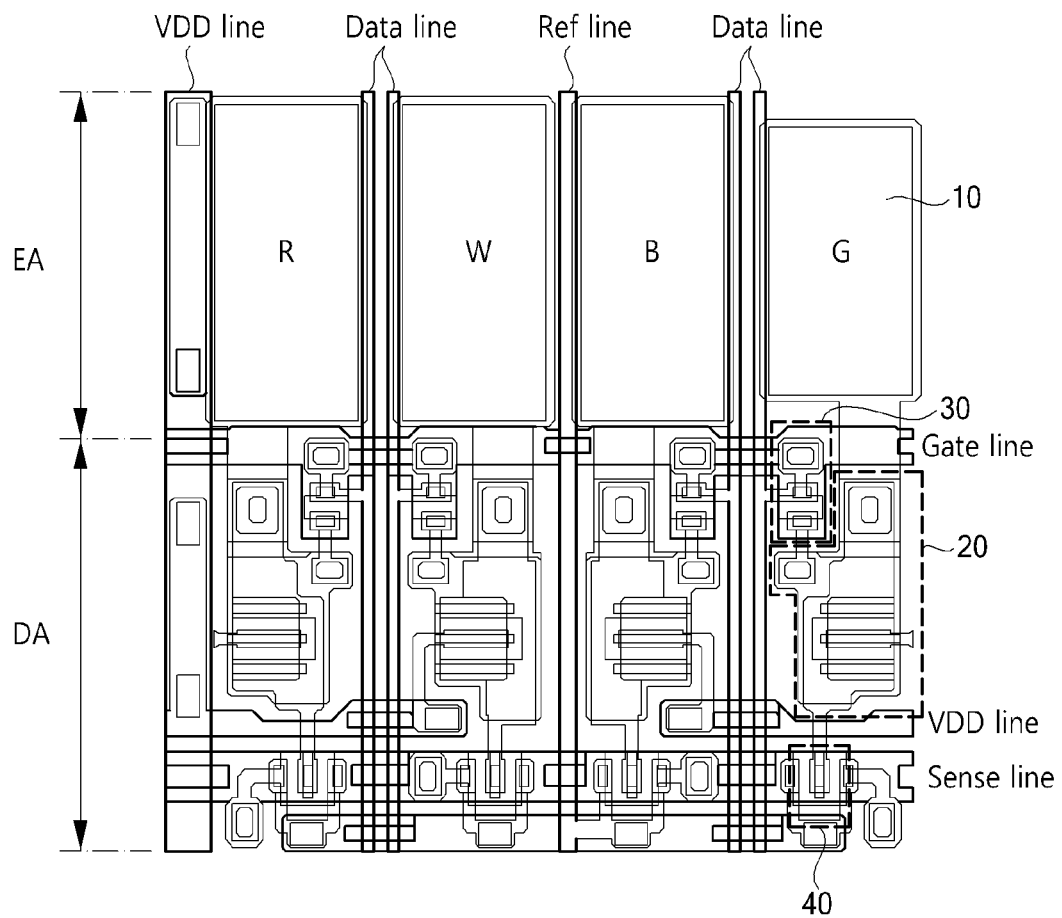
FIG. 2 is a plan view of a portion of a display area of an organic light emitting display device, and illustrating one unit pixel disposed on a last horizontal line among all the pixels.
Figure 3:
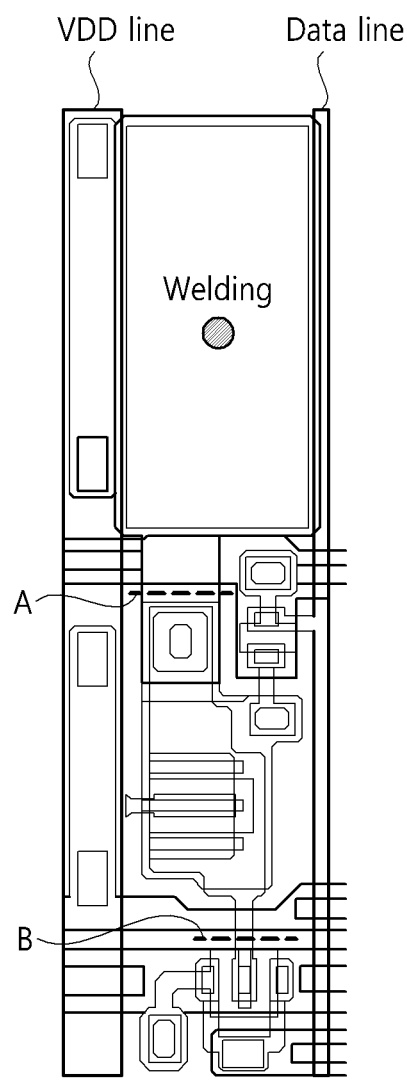
FIG. 3 is a diagram illustrating that a pixel in which a hot spot error occurs is repaired and blackened.

Reference will now be made in detail to the exemplary embodiments of the present invention, examples of which are illustrated in the accompanying drawings. Wherever possible, the same reference numbers will be used throughout the drawings to refer to the same or like parts. It should be noted that like reference numerals used in the specification for each drawing to denote like elements in other drawings are used for elements wherever possible.

The terms described in the specification should be understood as follows. The singular forms "a", "an" and "the" are intended to include the plural forms as well, unless the context clearly indicates otherwise. The terms "first" and "second" are for differentiating one element from the other element, and these elements should not be limited by these terms.

It should be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof.

In descriptions of embodiments of the present invention, when a structure is described as being formed at an upper portion/lower portion of another structure or on/under the other structure, this description should be construed as including the structure and the another structure being in contact with each other or the structure and the another structure being separated by a third structure. Hereinafter, an organic light emitting display device, and a pixel repairing method therefore, according to embodiments of the present invention will be described in detail with reference to the accompanying drawings.

Figure 4:
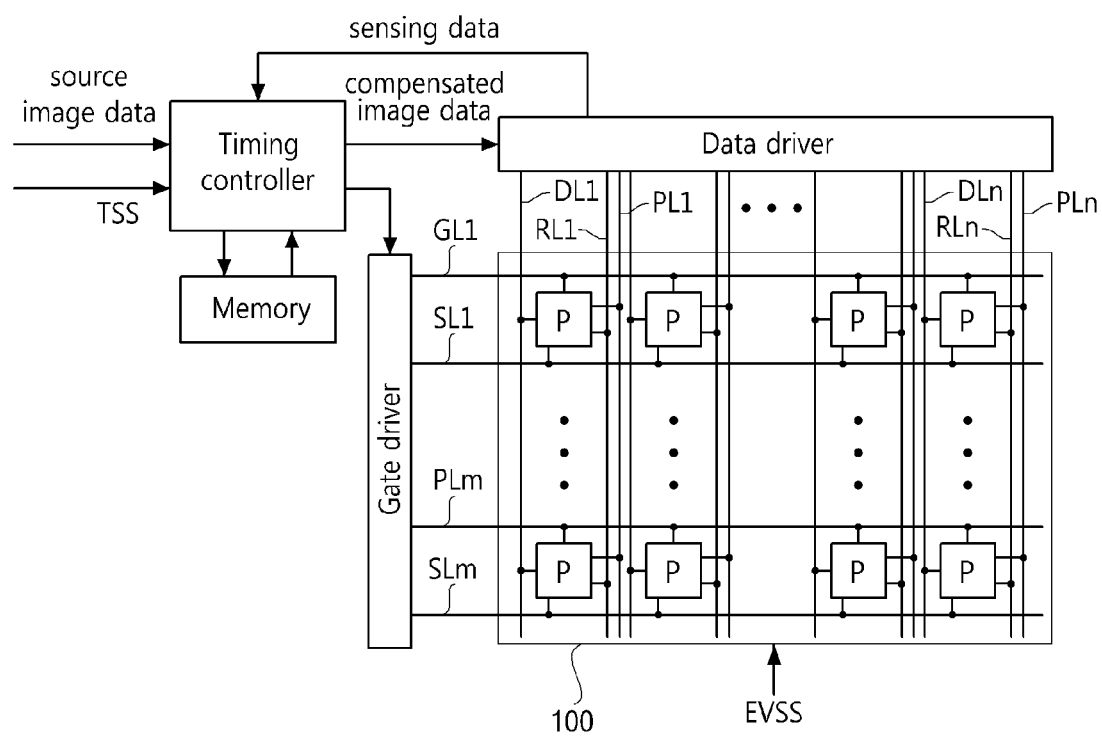
FIG. 4 is a diagram schematically illustrating an organic light emitting display device.

FIG. 4 is a diagram schematically illustrating an organic light emitting display device. The organic light emitting display device according to the first embodiment of the present invention includes a display panel 100 and a driving circuit unit.

The driving circuit unit includes a data driver, a gate driver, a timing controller, a memory, and a power supply. The driving circuit unit is provided on a chip-on film (COF) and a printed circuit board (PCB) on which a plurality of driving ICs are mounted. Power and a driving signal are supplied to the display panel 100 by using film-on glass (FOG).

The timing controller aligns video data in units of a frame, and supplies the aligned image data to the data driver. Also, the timing controller operates the data driver and the gate driver in a driving mode on the basis of a vertical sync signal Vsync, a horizontal sync signal Hsync, a data enable signal DE, and a clock DCLK. Also, the timing controller operates the data driver and the gate driver in a sensing mode to allow a characteristic (a threshold voltage/mobility) of a driving TFT DT formed in each of a plurality of sub-pixels to be sensed.

The gate driver operates in the driving mode and the sensing mode according to a mode control of the timing controller. In the driving mode, the gate driver generates a scan signal having a gate-on voltage level at every one horizontal period according to a gate control signal GCS supplied from the timing controller, and sequentially supplies the generated scan signal to a plurality of gate lines GL. In the sensing mode, the gate driver generates a sense signal having the gate-on voltage level, and sequentially supplies the sense signal to a plurality of sense signal lines SL.

The gate driver is connected to the plurality of gate lines GL1 to GLm, the plurality of sense signal lines SL1 to SLm, and a plurality of power lines (VDD lines) PL1 to PLn. The gate driver may be provided in an IC type, and connected to the display panel 100 through a flexible cable. As another example, when forming a transistor of each of a plurality of pixels P in a panel, the gate driver may be directly provided in a non-display area of an array substrate of the display panel 100 through the same manufacturing process.

The data driver is connected to a plurality of data lines DL1 to DLn, and operates in the display mode and the sensing mode according to control by the timing controller. The data driver converts corrected image data, supplied from the timing controller, into a data voltage Vdata, and supplies the data voltage to a data line DL.

An initial compensation voltage for compensating for a threshold voltage (Vth) of the driving TFT DT of each pixel P is stored in the memory. Also, sequential compensation data for compensating for a shift, caused by driving of the display panel 100, of the threshold voltage (Vth) of the driving TFT DT of each pixel P is stored in the memory. The timing controller may load the sequential compensation data stored in the memory to perform sequential compensation. The timing controller loads, from the memory, an initial compensation value for compensating for the shift of the threshold voltage (Vth) of the driving TFT DT, and reflects the loaded compensation value in the corrected image data.

The display panel 100 includes a plurality of OLEDs, an array substrate in which a plurality of pixel circuits for emitting light from the plurality OLEDs are formed, and an encapsulating substrate that encapsulates the plurality of OLEDs.

The display panel 100 includes an active area, in which the plurality of pixels are arranged in a matrix type and an image is displayed, and a non-display area in which a plurality of link lines and a plurality of log lines are formed.

The plurality of gate lines GL1 to GLm, the plurality of sense signal lines SL1 to SLm, the plurality of data lines DL1 to DLn, the plurality of power lines (the VDD lines) PL1 to PLn, and a plurality of reference voltage lines RL1 to RLn are formed in the active area of the array substrate, and the plurality of pixels are defined by the lines. A red (R) pixel, a green (G) pixel, a blue (B) pixel, and a white (W) pixel constitute one unit pixel.

Each of the plurality of pixels P includes an OLED and a pixel circuit that emits light from the OLED. The pixel circuit includes a driving TFT, a scan TFT, and a sense TFT.

The scan signal (a gate driving signal) is applied from the gate driver to the gate line GL. A sense signal is applied from the gate driver to the sense signal line SL.

Data voltages Vdata are applied from the data driver to the plurality of data lines DL. The data voltages Vdata may include a compensation voltage for compensating for the shift of the threshold voltage (Vth) of the driving TFT DT of each pixel P.

A display reference voltage or a sensing precharging voltage may be selectively supplied from the data driver to the reference voltage line RL. The display reference voltage is supplied to each of the plurality of reference voltage lines RL during a data charging period of each pixel. The sensing precharging voltage may be supplied to the reference voltage line RL during a sensing period in which a threshold voltage/mobility of the driving TFT DT of each pixel P is sensed.

Figure 5:
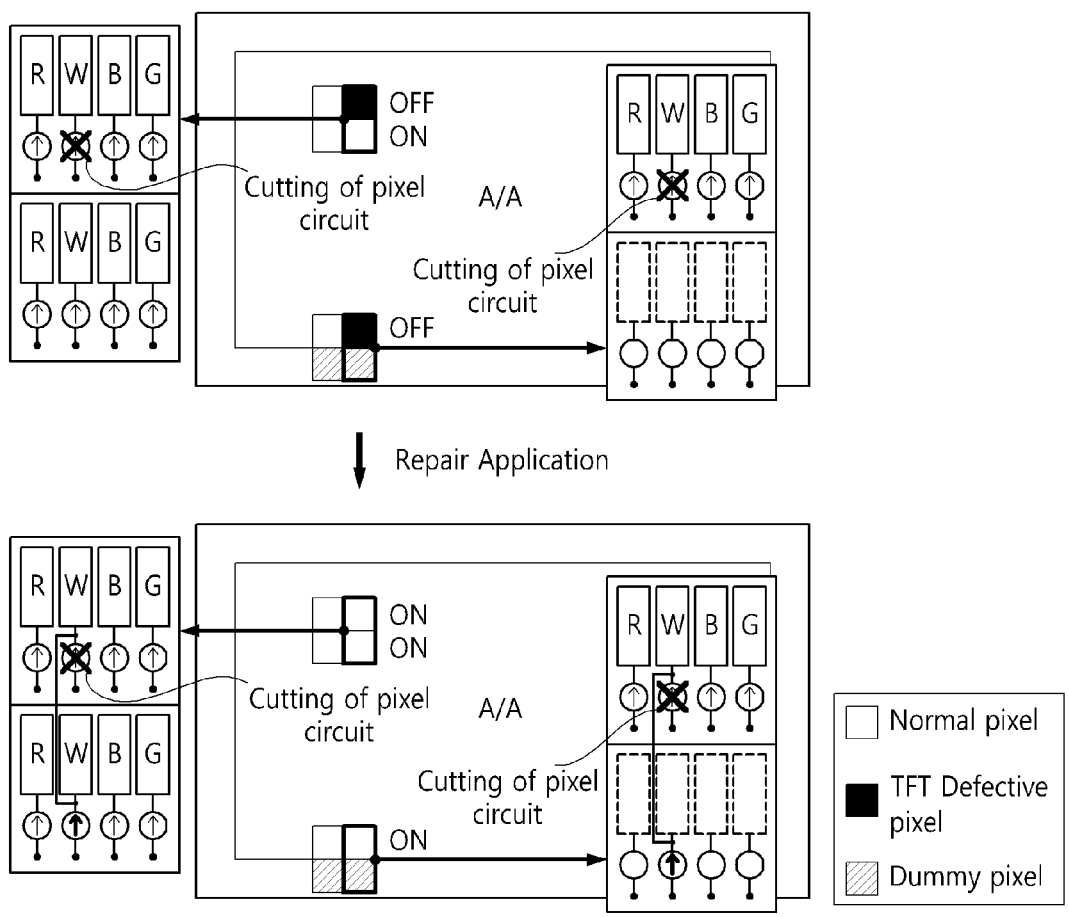
FIG. 5 is a diagram illustrating, for example, an overview of the present invention including a method of repairing hot spot errors or dark spot errors of pixels (pixels formed at a last horizontal line) formed at an outermost portion among pixel areas emitting light in an active area.

Next, FIG. 5 is a diagram illustrating, for example, an overview of the present invention including a method of repairing hot spot errors or dark spot errors of pixels (pixels formed at a last horizontal line) formed at an outermost portion among pixel areas emitting light in an active area. The organic light emitting display device according to an embodiment of the present invention, a plurality of pixel areas that emit light are formed in the active area. Also, a plurality of dummy pixels that cannot actually emit light are formed under the pixel areas that emit light.

When an error occurs in pixel areas (pixel areas formed at an outermost portion) disposed on an Nth horizontal line among N number of horizontal lines formed in the active area, repair is performed so that a signal applied to anode electrodes of two pixels which are vertically adjacent to each other is shared. That is, when an error occurs in a pixel area which is disposed on a last row among the plurality of pixel areas emitting light, repair is performed by using a dummy pixel which is formed under the pixel area in which the error occurs.

For example, since a pixel circuit in the first pixel area, which is formed on an outermost line (a last row) among the pixel areas that actually emit light, is not normally provided, a hot spot error or a dark spot error occurs in a first pixel area. In this case, an anode electrode of the OLED is disconnected from the driving TFT of the pixel circuit in the first pixel area. Also, a drain electrode of the sense TFT is disconnected from the driving TFT.

Furthermore, a signal applied to an anode electrode in a first dummy pixel area, formed under the first pixel area in which an error occurs, among a plurality of dummy pixel areas formed under the pixel areas emitting light is applied to a first pixel. To this end, the first pixel area in which the error occurs is repaired by performing a welding process.

Here, the pixel circuit in the first pixel area formed on the outermost line (the last row) among the pixel areas that actually emit light is cut, and cannot operate. Therefore, driving signals which are applied to the pixel circuit in the first pixel area are applied to a pixel circuit in the first dummy pixel area formed under the first pixel area.

An error can occur in pixel areas disposed on first to N–1st horizontal lines among the N horizontal lines formed in the active area. In this case, a pixel area in which an error occurs is repaired so that a signal applied to anode electrodes of two pixels which are vertically adjacent to each other is shared.

For example, a pixel circuit in a second pixel area formed on a second row in the active area is not normally provided, and for this reason, a hot spot error or a dark spot error can occur in a second pixel area. In this case, a driving TFT of the pixel circuit in the second pixel area is disconnected from the anode electrode of the OLED. Also, the drain electrode of the sense TFT is disconnected from the driving TFT.

The welding process is performed so that a signal, applied to an anode electrode in a third pixel area which is formed on a third row and under the second pixel area, is applied to the second pixel area in common. Therefore, the second pixel area in which an error occurs is repaired.

Figure 6:
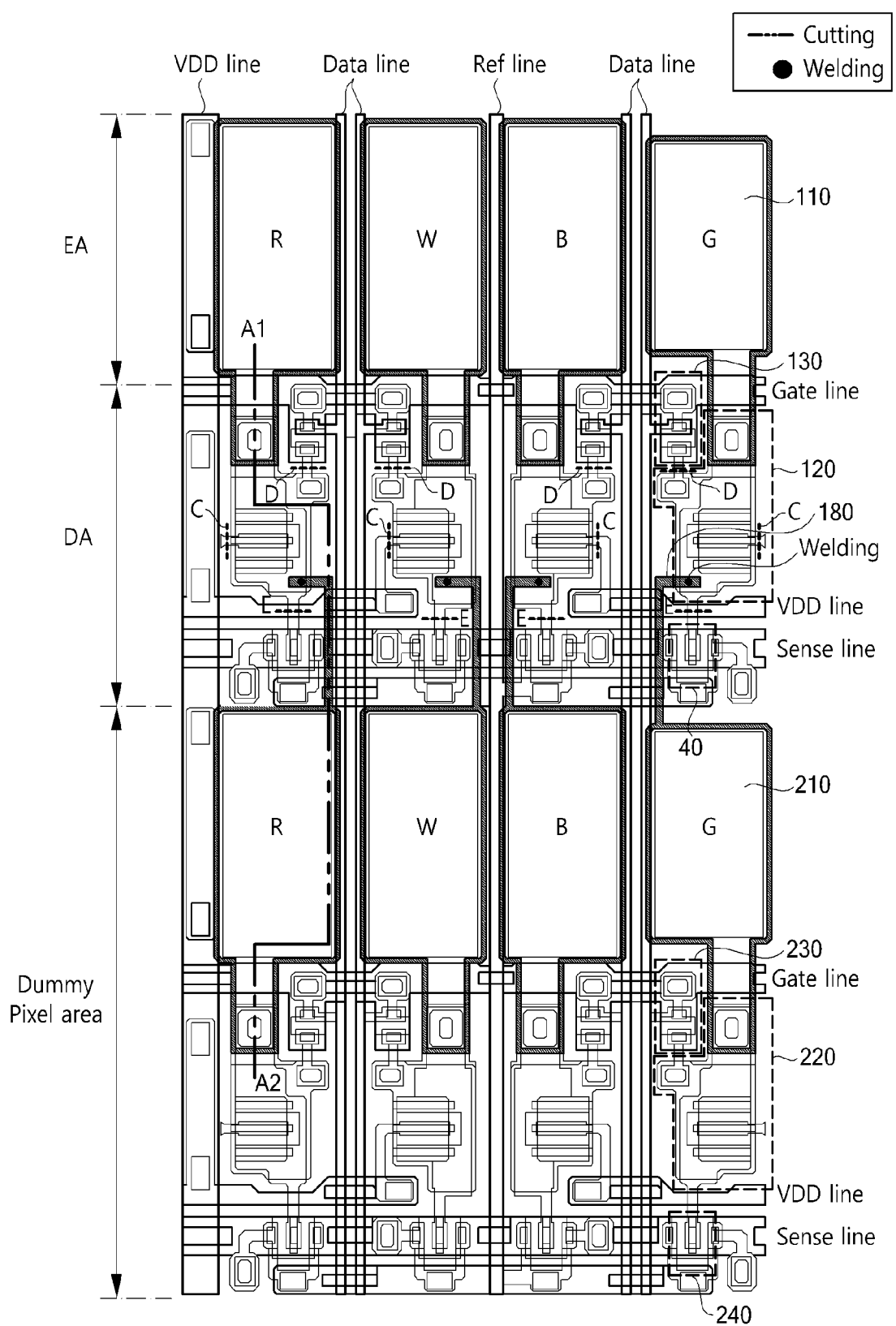
FIG. 6 is an overview of the present invention including a plan view illustrating a pixel structure of an organic light emitting display device, and is a view illustrating a welding part and a cutting part of each of pixels which are repaired.

Next, FIG. 6 is an overview of the present invention including a plan view illustrating a pixel structure of an organic light emitting display device, and is a view illustrating a welding part and a cutting part of each of pixels which are repaired. The plan view illustrates a pixel area in which a hot spot error or a dark spot error occurs and which is repaired to normally emit light. An area in which a pixel circuit is provided in each pixel area is defined as a pixel circuit area CA. The pixel circuit includes a plurality of driving TFTs 120 and 220, a plurality of scan TFTs 130 and 230, and a plurality of sense TFTs 140 and 240. An area in which a plurality of OLEDs 110 and 210 are formed is defined as an emission area EA.

Here, the plurality of driving TFTs 120 and 220, the plurality of scan TFTs 130 and 230, and each of the plurality of sense TFTs 140 and 240 may be an N type or a P type transistor including a low temperature poly-silicon (LTPSL) or oxide as an active material.

Four pixel areas (red, green, blue, and white pixel areas) are formed on an outermost line (a last row) among a plurality of pixel areas emitting light. Four dummy pixel areas (red, green, blue, and white dummy pixel areas) among a plurality of dummy pixel areas are formed under the plurality of pixel areas emitting light.

The emission area EA is defined by intersection between the data line and the gate line. The plurality of pixels are formed in the emission area. The red pixel, the green pixel, the blue pixel, and the white pixel constitute one unit pixel. The pixel circuit area CA is defined between the gate line and the sense signal line.

An OLED 110 is formed in the emission area EA in four pixel areas formed on an outermost line (a last row) among the pixel areas emitting light. The driving TFT 120, the scan TFT 130, and the sense TFT 140 are formed in the pixel circuit area CA. Moreover, a dummy OLED 210 is formed in the emission area EA in four dummy pixel areas formed under the pixel areas emitting light. Because an organic emission layer EML is not formed in the dummy OLED 210, even when a signal is supplied to the dummy OLED 210, the dummy OLED 210 does not actually emit light.

A dummy driving TFT 220, a dummy scan TFT 230, and a dummy sense TFT 240 are formed in the pixel circuit area CA.

The data line and a driving voltage line (a VDD line) are formed in a vertical direction. The vertically formed driving voltage line is branched in a horizontal direction, and connected to the driving TFT 120 and the dummy driving TFT 220. A driving voltage VDD is supplied to the driving TFT 120, which is formed in a pixel circuit in a pixel area emitting light, and the dummy driving TFT 220 which is formed in a dummy pixel circuit.

The gate line and the sense signal line are formed in a horizontal direction. The gate line is connected to a gate electrode of the scan TFT 130 and a gate electrode of the dummy scan TFT 230. The scan signal is applied to the scan TFT 130 and the dummy scan TFT 230 through the gate line. The sense signal line is connected to a gate electrode of the sense TFT 140 and a gate electrode of the dummy sense TFT 240. A sense signal is applied to the sense TFT 140 and the dummy sense TFT 240 through the sense signal line.

A source electrode of each of the driving TFT 120 and the dummy driving TFT 220 is connected to the driving voltage line (the VDD line), and a drain electrode is connected to an anode electrode of the OLED 110. A gate electrode of the driving TFT 120 is connected to a drain electrode of the scan TFT 130. A gate electrode of the dummy driving TFT 220 is connected to a drain electrode of the dummy scan TFT 230. A gate electrode of each of the scan TFT 130 and the dummy scan TFT 230 is connected to the gate line, and a source electrode is connected to the data line. A gate electrode of each of the sense TFT 140 and the dummy sense TFT 240 is connected to the sense signal line.

The drain electrode of the sense TFT 140 is connected to the drain electrode of the driving TFT 120, and the gate electrode of the dummy sense TFT 240 is connected to the drain electrode of the dummy driving TFT 220. The source electrode of the sense TFT 140 and the source electrode of the dummy sense TFT 240 are connected to the reference voltage line (Ref line).

The driving TFT 120 and the scan TFT 130 or the sense TFT 140 in the pixel area, formed on the outermost line (the last line) in the pixel areas emitting light, cannot be driven normally. In this case, a current is not applied to the OLED 110, and for this reason, a dark spot error occurs. Also, the source electrode of the driving TFT 120 may be short-circuited with the drain electrode of the driving TFT 120. In this case, the driving TFT 120 is not driven normally, and a voltage applied to the source electrode is directly applied to the drain electrode. Therefore, the driving TFT 120 maintains a turn-on state without being turned off, and for this reason, a hot spot error in which the OLED 110 is continuously turned on can occur.

The organic light emitting display device and the pixel repairing method according to an embodiment of the present invention can repair a dark spot error and a hot spot error in the pixel area formed on the outermost line (the last line) in the pixel areas emitting light.

A point C, which is an input terminal of the driving TFT 120 of the pixel circuit in a pixel area where an error occurs, is first cut by a laser. Also, a point D that is an output terminal of the scan TFT 130 is cut by the laser. Also, a point E that connects the sense TFT 140 to the driving TFT 120 is cut. As described above, the pixel circuit in a pixel area where an error occurs cannot operate by cutting the points C, D and E.

A bridge line 180 is formed, and connects a metal layer, connected to an anode electrode 112 in a pixel area which is intended to emit light, to an anode electrode 212 in a dummy pixel area. In this case, a welding part is formed by a laser for the bridge line 180 to be connected to the anode electrode 112 in the pixel area.

As described above, the anode electrode 112 in a pixel area where an error occurs is connected to the anode electrode 212 in the dummy pixel area, and thus, a signal which is output from the pixel circuit in the dummy pixel area is applied to the pixel area where the error occurs.

Subsequently, a signal is applied to the pixel circuit in the dummy pixel area corresponding to the pixel area where the error occurs, and thus, the pixel circuit in the dummy pixel area operates normally. Also, a signal supplied to the anode electrode 212 of the OLED 210 of a dummy pixel is supplied to the anode electrode 112 of the OLED 110 in the pixel area where the error occurs.

Figure 7:
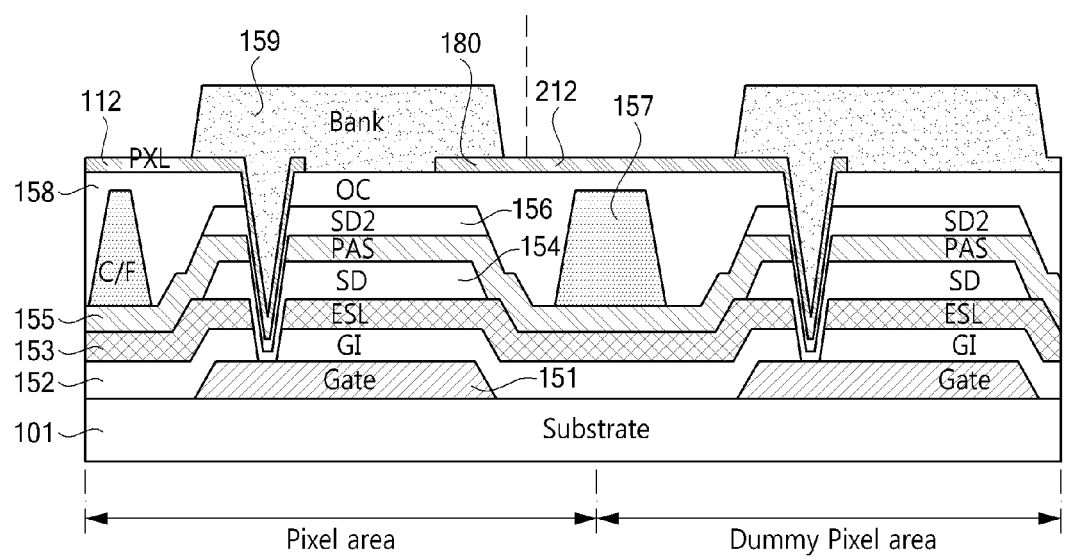
FIG. 7 is a cross-sectional view taken along line A1-A2 of FIG. 6 according to a first embodiment of the present invention, and illustrates a cross-sectional structure of a dummy pixel area and a pixel area in which an error does not occur.

Next, FIG. 7 is a cross-sectional view taken along line A1-A2 of FIG. 6 according to a first embodiment of the present invention, and illustrates a cross-sectional structure of a dummy pixel area and a pixel area in which an error does not occur. The dummy pixel area and the pixel area include an etch stop layer (ESL)-type driving TFT. A lower gate electrode 151 is formed in the pixel area and the dummy pixel area on a substrate 101. In this case, the lower gate electrode 151 may act as a first electrode of a storage capacitor Cst.

Here, the lower gate electrode 151 may be formed of a single layer by using molybdenum (Mo), titanium (Ti), or copper (Cu). As another example, the lower gate electrode 151 may be formed in a multi-layer structure. A lower gate of a driving TFT (D-TFT) and a first electrode (a lower electrode) of the storage capacitor Cst are formed of one lower gate electrode 151. In this case, the lower gate electrode 151 is formed of the same metal as that of the scan line and the sense signal line.

A gate insulating layer (GI) 152 is formed to cover the lower gate electrode 151. The gate insulating layer (GI) 152 may be formed of a single layer formed of $SiO_2$ or SiNx, and may be configured with a first layer formed of $SiO_2$ and a second layer formed of SiNx. An active layer can be formed in a driving TFT (D-TFT) area on the gate insulating layer (GI) 152, the active layer being formed of oxide such as indium gallium oxide (IGO), indium zinc oxide (IZO), or amorphous indium-gallium zinc oxide (IGZO). The dummy pixel area and the pixel area include a cross-sectional surface of a portion in which the active layer is not formed.

An etch stop layer (ESL) 153 is formed on the gate insulating layer 152 and on the active layer. The etch stop layer 153 is formed of $SiO_2$. A source/drain metal layer 154 is formed on the etch stop layer 153. A source S and a drain D are formed of the source/drain metal layer 154 in the driving TFT area.

The source S and drain D of a driving TFT is formed to pass through the etch stop layer 153 in an area overlapping the active layer, on the etch stop layer 153. The source/drain metal layer 154 formed in the driving TFT area is patterned on the active layer. One side of the source/drain metal layer 154 is the drain D, and the other side is the source S.

The source/drain metal layer 154 may be a single layer formed by using molybdenum (Mo), titanium (Ti), or copper (Cu). As another example, the source/drain metal layer 154 may be formed in a multi-layer structure. A first layer may be formed of an alloy of MoTi, and a second layer may be formed of Cu. In this case, the source/drain metal layer 154 is formed of the same metal as that of the data line at the same time with a mask process. Here, the drain D of the driving TFT is connected to a VDD line.

A passivation layer (PAS) 155 is formed to cover the source/drain of the driving TFT. The passivation layer 155 is formed of $SiO_2$. An upper gate electrode (SD2) 156 is formed on the passivation layer 155. The upper gate electrode 156 acts as, and configures, an upper gate of the driving TFT and a second electrode (an upper electrode) of the storage capacitor Cst. The upper gate electrode 156 may be formed in a multi-layer structure. A first layer may be formed of an alloy of MoTi, and a second layer may be formed of ITO.

A color filter (C/F) 157 is formed in an opening of the pixel area, and a planarizing layer 158 is formed to cover the color filter 157 and TFTs. A bank 159 is formed at a non-emission part in the pixel area, for distinguishing a plurality of the pixel areas.

The anode electrode 112 of an OLED is formed on the planarizing layer in the opening, and although not shown, an emission layer EML is formed on the anode electrode 112. Furthermore, a cathode electrode is formed all over a substrate.

Next, FIG. 7 is a cross-sectional view taken along line A1-A2 of FIG. 6 according to a first embodiment of the present invention, and illustrates a cross-sectional structure of a dummy pixel area and a pixel area in which an error does not occur. The anode electrode 212 is formed in the dummy pixel area and extending in the pixel area emitting light, and the portion of the anode electrode 212 in the pixel area emitting light is formed to overlap the upper gate electrode 156 in the pixel area. That is, the bridge line 180 is formed from a portion of the anode electrode 212 that extends into the pixel area emitting light.

Repair Structure in a Pixel Area According to a Second Embodiment

Figure 8:
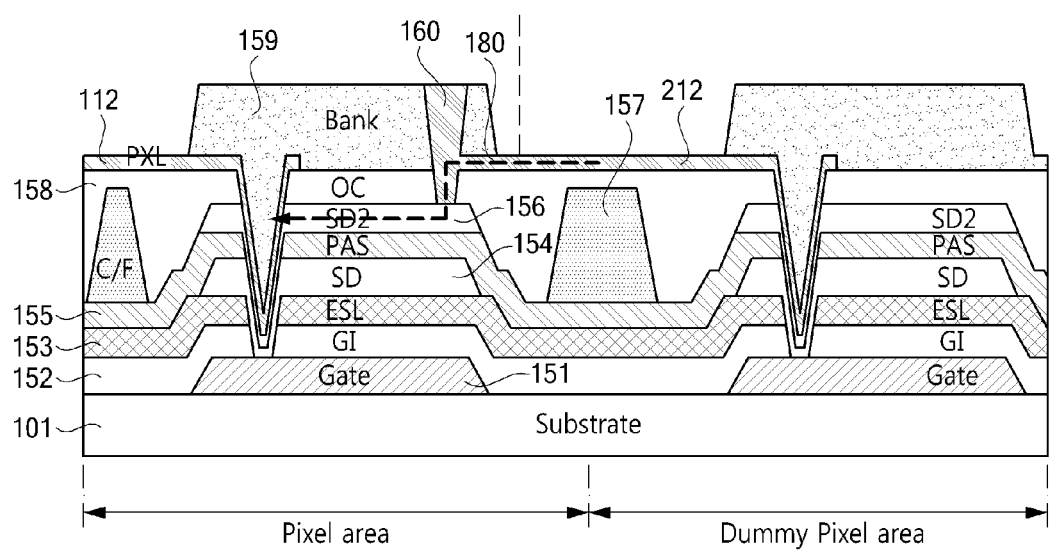
FIG. 8 is a cross-sectional view taken along line A1-A2 of FIG. 6 according to a second embodiment of the present invention, and illustrates a cross-sectional structure of a dummy pixel area and a pixel area in which a repair structure is applied to a pixel area where an error occurs.

Next, FIG. 8 is a cross-sectional view taken along line A1-A2 of FIG. 6 according to a second embodiment of the present invention, and illustrates a cross-sectional structure of a dummy pixel area and a pixel area in which a repair structure is applied to a pixel area where an error occurs.

The bridge line 180 which is formed by extending a length of the anode electrode 212 in the dummy pixel area overlaps a pixel circuit which is disposed at an upper side in the pixel area (refer to FIGS. 6-8). A welding part 160 is formed by a laser for the bridge line 180 to be connected to the pixel circuit in the pixel area. In detail, the bridge line 180 which is formed by extending a length of the anode electrode 212 in the dummy pixel area overlaps an uppermost metal layer (i.e., the upper gate electrode 156) of the driving TFT 120 in the pixel area intended to emit light.

The welding part 160 is formed in an area where the bridge line 180 overlaps the gate electrode 156, so that a metal layer connected to the anode electrode 112 in the pixel area intended to emit light is connected to the anode electrode 212 in the dummy pixel area. The welding part 160 is formed at a front surface of a panel by using a laser.

By using a dummy pixel, the organic light emitting display device and the pixel repairing method according to the second embodiment of the present invention repair a hot spot error or a dark spot error in a pixel area formed on a last horizontal line among a plurality of pixel areas emitting light. As a result, a yield rate of organic light emitting display devices is increased, and manufacturing cost can be reduced.

Repair Structure in a Pixel Area According to a Third Embodiment

Figure 9:
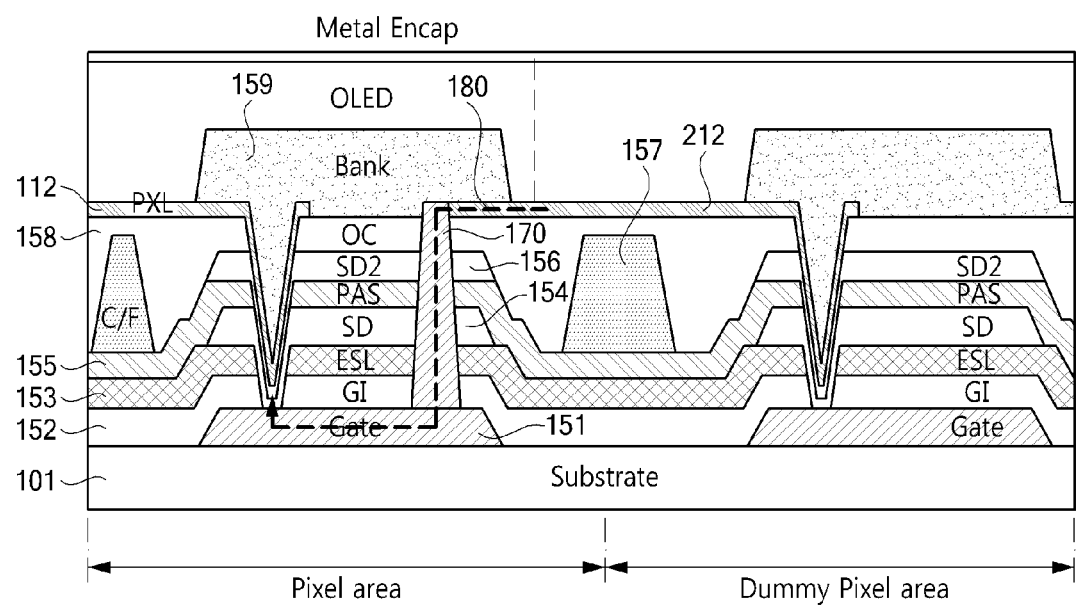
FIG. 9 is a cross-sectional view taken along line A1-A2 of the organic light emitting display device according to a third embodiment of the present invention, and illustrates a cross-sectional structure of a dummy pixel area and a pixel area in which a repair structure is applied to a pixel area where an error occurs.

Next, FIG. 9 is a cross-sectional view taken along line A1-A2 of FIG. 6 according to a third embodiment of the present invention, and illustrates a cross-sectional structure of a dummy pixel area and a pixel area in which a repair structure is applied to a pixel area where an error occurs. The bridge line 180 which is formed by extending a length of the anode electrode 212 in the dummy pixel area overlaps a pixel circuit which is disposed at an upper side in the pixel area (refer to FIGS. 6 and 9). A welding part 170 is formed by a laser for the bridge line 180 to be connected to the pixel circuit in the pixel area.

In detail, the bridge line 180 which is formed by extending a length of the anode electrode 212 in the dummy pixel area overlaps an uppermost metal layer (i.e., the upper gate electrode 156) of the driving TFT 120 in the pixel area intended to emit light. The welding part 170 is formed in an area where the bridge line 180 overlaps the gate electrode 156, so that a metal layer connected to the anode electrode 112 in the pixel area intended to emit light is connected to the anode electrode 212 in the dummy pixel area. The welding part 170 is formed at a rear surface of a panel by using a laser.

Although the driving TFT can be the ESL-type driving TFT (refer to FIGS. 7 to 9), the present invention is not limited thereto. For example, the repair structure of the pixel (refer to FIGS. 6 to 9) may be applied to a back channel etching (BCE)-type driving TFT. The scan TFT and the sense TFT may be formed to have the same structure as that of the driving TFT (refer to FIGS. 7 to 9).

As described above, according to the embodiments of the present invention, when an error occurs in a pixel area formed at an outermost portion, an output signal of a dummy pixel is applied to an outermost pixel area in which the error occurs. Therefore, a hot spot and a dark spot in the outermost pixel area can be repaired.

In the organic light emitting display device according to the embodiments of the present invention, the pixel circuit in the first pixel area includes the driving TFT, the scan TFT, and the sense TFT. Also, an input terminal of the driving TFT of the pixel circuit in the first pixel area is cut, an output terminal of the scan TFT is cut, and a portion in which the sense TFT is connected to the driving TFT is cut. Therefore, the sense TFT is short-circuited with the driving TFT. An output signal of the pixel circuit in the first dummy pixel area is supplied to, through the bridge line, the anode electrode in the first pixel area. Among the plurality of pixel areas emitting light, the first pixel area in which the error occurs is disposed at an outermost portion. The welding part which is formed in an area where the bridge line overlaps the pixel circuit in the first pixel area, and connects the bridge line to the pixel circuit in the first pixel area.

In addition, in the organic light emitting display device according to the embodiments of the present invention, the bridge line overlaps the upper gate electrode of the driving TFT in the first pixel area, and is connected to the upper gate electrode by the welding part. The bridge line overlaps the upper gate electrode and lower gate electrode of the driving TFT in the first pixel area, and is connected to the upper gate electrode by the welding part. The anode electrode in the first pixel area is connected to the anode electrode in the first dummy pixel area through the bridge line and the metal layer of the pixel circuit in the first pixel area.

In addition, according to the embodiments of the present invention as described above, the organic light emitting display device and the pixel repairing method repair hot spot errors or dark spot errors of pixels formed at an outermost portion (formed on a last horizontal line) among a plurality of pixel areas emitting light by using a dummy pixel. Accordingly, a yield rate of organic light emitting display devices can increase, and the manufacturing cost can be reduced.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. An organic light emitting display device comprising:
    a plurality of pixel areas including an emission area and a pixel circuit area, the plurality of pixel areas being configured to emit light;
    a plurality of dummy pixel areas formed adjacent to the plurality of pixel areas to include a non-emission area and a pixel circuit area;
    an anode electrode form in the plurality of dummy pixel areas; and
    a bridge line formed from a portion of the anode electrode and in the plurality of pixel areas.

2. The organic light emitting display device of claim 1, further comprising:
    a bridge line extending, in each of corresponding dummy pixel areas, a length of an anode electrode and overlapping, in each of corresponding pixel areas configured to emit light, an upper gate electrode of the driving TFT; and
    a welding part, in each of the corresponding pixel areas configured to emit light, connected to the bridge line and the upper gate electrode of the driving TFT.

3. The organic light emitting display device of claim 1, wherein, when an error occurs in pixel areas formed at an outermost portion of an active area of the display device, a signal applied to anode electrodes of two pixels which are vertically adjacent to each other is shared to repair the error.

4. The organic light emitting display device of claim 1, further comprising:
    a color filter formed in each of corresponding pixel areas emitting light above a passivation layer and below the bridge line.

5. The organic light emitting display device of claim 1, wherein an output signal of the pixel circuit in a first dummy pixel area is supplied to, through the bridge line, an anode electrode in the first pixel area.

6. The organic light emitting display device of claim 1, wherein an anode electrode in the first pixel area is connected to the anode electrode in the first dummy pixel area through the bridge line and a metal layer of the pixel circuit in the first pixel area.

7. The organic light emitting display device of claim 1, wherein each of the plurality of pixel areas and the plurality of dummy pixel areas includes:
    a first pixel;
    a lower gate electrode formed on a substrate;
    a gate insulating layer formed to cover the lower gate electrode;
    an active layer formed on the gate insulating layer;
    an etch stop layer formed on the active layer;
    a source/drain metal layer formed on the etch stop layer;
    a passivation layer formed to cover the source/drain metal layer;
    an upper gate electrode formed on the passivation layer;
    a color filter formed in an opening of a pixel;
    a planarizing layer formed to cover the upper gate electrode and the color filter; and
    an anode electrode formed on the planarizing layer.

8. The organic light emitting display device of claim 1, further comprising:

a welding part in each of corresponding pixel areas, the welding part connecting the bridge line to a metal layer of the pixel circuit in a first pixel area; and an anode electrode of the first pixel area, the anode electrode being connected to an anode electrode of a first dummy pixel area.

9. The organic light emitting display device of claim 1, wherein the pixel circuit in a first pixel area includes a driving thin film transistor (TFT), a scan TFT, and a sense TFT, wherein an input terminal of the driving TFT of the pixel circuit in the first pixel area is cut, wherein an output terminal of the scan TFT is cut, and wherein a portion in which the sense TFT is connected to the driving TFT is cut, and the sense TFT is short-circuited with the driving TFT.

10. The organic light emitting display device of claim 1, wherein an output signal of the pixel circuit in a first dummy pixel area is supplied to, through the bridge line, an anode electrode in a first pixel area.

11. A system for repairing an organic light emitting display device, the system comprising:

a plurality of pixel areas formed in the organic light emitting display device and including an emission area and a pixel circuit area, the plurality of pixel areas being configured to emit light;

a plurality of dummy pixel areas formed adjacent to the plurality of pixel areas in the organic light emitting display device and including a non-emission area and a pixel circuit area;

an anode electrode form in the plurality of dummy pixel areas; and a bridge line formed from a portion of the anode electrode and in the plurality of pixel areas.

12. The system of claim 11, further comprising:

a bridge line extending, in each of corresponding dummy pixel areas, a length of an anode electrode and overlapping, in each of corresponding pixel areas configured to emit light, an upper gate electrode of the driving TFT; and a welding part, in each of the corresponding pixel areas configured to emit light, connected to the bridge line and the upper gate electrode of the driving TFT.

13. The system of claim 11, wherein, when an error occurs in pixel areas formed at an outermost portion of an active area of the display device, a signal applied to anode electrodes of two pixels which are vertically adjacent to each other is shared to repair the error.

14. The system of claim 11, further comprising:

a color filter formed in each of corresponding pixel areas configured to emit light above a passivation layer and below the bridge line.

15. The system of claim 11, wherein an output signal of the pixel circuit in a first dummy pixel area is supplied to, through the bridge line, an anode electrode in the first pixel area.

16. The system of claim 11, wherein an anode electrode in the first pixel area is connected to the anode electrode in the first dummy pixel area through the bridge line and a metal layer of the pixel circuit in the first pixel area.

17. The system of claim 11, wherein each of the plurality of pixel areas and the plurality of dummy pixel areas includes:

a first pixel;

a lower gate electrode formed on a substrate;

a gate insulating layer formed to cover the lower gate electrode;

an active layer formed on the gate insulating layer;

an etch stop layer formed on the active layer;

a source/drain metal layer formed on the etch stop layer;

a passivation layer formed to cover the source/drain metal layer;

an upper gate electrode formed on the passivation layer;

a color filter formed in an opening of a pixel;

a planarizing layer formed to cover the upper gate electrode and the color filter; and an anode electrode formed on the planarizing layer.

18. The system of claim 11, further comprising:

a welding part in each of corresponding pixel areas, the welding part connecting the bridge line to a metal layer of the pixel circuit in a first pixel area; and an anode electrode of the first pixel area, the anode electrode being connected to an anode electrode of a first dummy pixel area.

19. The system of claim 11, wherein the pixel circuit in a first pixel area includes a driving thin film transistor (TFT), a scan TFT, and a sense TFT, wherein an input terminal of the driving TFT of the pixel circuit in the first pixel area is cut, wherein an output terminal of the scan TFT is cut, and wherein a portion in which the sense TFT is connected to the driving TFT is cut, and the sense TFT is short-circuited with the driving TFT.

20. The system of claim 11, wherein an output signal of the pixel circuit in a first dummy pixel area is supplied to, through the bridge line, an anode electrode in a first pixel area.

* * * * *

UNITED STATES PATENT AND TRADEMARK OFFICE
CERTIFICATE OF CORRECTION

| | | |
|---|---|---|
| PATENT NO. | : 9,093,023 B1 | Page 1 of 1 |
| APPLICATION NO. | : 14/547885 | |
| DATED | : July 28, 2015 | |
| INVENTOR(S) | : Jeong Hwan Kim et al. | |

It is certified that error appears in the above-identified patent and that said Letters Patent is hereby corrected as shown below:

ON THE TITLE PAGE:

Please insert the following:

-- (30)    Foreign Application Priority Data

May 30, 2014   (KR) ..................... 10-2014-0066459 --.

Signed and Sealed this
Ninth Day of February, 2016

Michelle K. Lee
*Director of the United States Patent and Trademark Office*